United States Patent
Zheng et al.

(10) Patent No.: US 11,190,199 B1
(45) Date of Patent: Nov. 30, 2021

(54) ASYNCHRONOUS SUCCESSIVE APPROXIMATION REGISTER (SAR) ANALOG-TO-DIGITAL CONVERTER (ADC) TIMING ADJUSTMENT BASED ON OUTPUT STATISTICS

(71) Applicant: XILINX, INC., San Jose, CA (US)

(72) Inventors: Kevin Zheng, San Jose, CA (US); David Freitas, Morgan Hill, CA (US); Hsung Jai Im, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/103,652

(22) Filed: Nov. 24, 2020

(51) Int. Cl.
  *H03M 1/06* (2006.01)
  *H03M 1/46* (2006.01)
  *H03M 1/38* (2006.01)

(52) U.S. Cl.
  CPC .......... *H03M 1/0604* (2013.01); *H03M 1/38* (2013.01); *H03M 1/462* (2013.01); *H03M 1/468* (2013.01); *H03M 1/46* (2013.01)

(58) Field of Classification Search
  CPC ........ H03M 1/0604; H03M 1/38; H03M 1/46; H03M 1/462; H03M 1/468
  USPC .................................................. 341/118, 163
  See application file for complete search history.

(56) References Cited

U.S. PATENT DOCUMENTS

| | | | |
|---|---|---|---|
| 8,872,691 B1 * | 10/2014 | Stepanovic | H03M 1/06 341/158 |
| 9,048,860 B1 | 6/2015 | Quinn | |
| 9,484,945 B1 * | 11/2016 | Wan | H03M 1/125 |

OTHER PUBLICATIONS

Yu, Andrew, et al., "Understanding Metastability in SAR ADCs," IEEE Solid-State Circuits Magazine, Summer 2019, p. 16-32.
Bankman, Daniel, et al., "Understanding Metastability in SAR ADCs," IEEE Solid-State Circuits Magazine, Spring 2019, p. 86-97.
Duan, Yida, "Design Techniques for Ultra-High-Speed Time-Interleaved Analog-to-Digital Converters (ADCs)," Electrical Engineering and Computer Sciences University of California at Berkley, Technical Report No. UCB/EECS-2017-10, May 1, 2017, 82 pgs.
Ali, T et al., "6.4 A 180mW56Gb/s DSP-Based Transceiver for High Density IOs in Data Center Switches In 7nm FinFET Technology," 2019 IEEE International Solid-State Circuits Conference—(ISSCC), 2019, pp. 118-120.

* cited by examiner

*Primary Examiner* — Khai M Nguyen
(74) *Attorney, Agent, or Firm* — Patterson + Sheridan, LLP

(57) ABSTRACT

Examples herein relate to electronic devices that include an asynchronous successive approximation register (SAR) analog-to-digital converter (ADC) that implements timing adjustment based on output statistics. In an example, an electronic device includes an asynchronous SAR ADC, a statistics monitor, and an operation setting circuit. The asynchronous SAR ADC is configured to output output data. The statistics monitor is configured to capture samples at a bit position of the output data. The statistics monitor is further configured to generate an operational setting based on the captured samples. The operation setting circuit is configured to adjust an operating condition of the asynchronous SAR ADC based on the operational setting.

20 Claims, 7 Drawing Sheets

ASYNCHRONOUS SUCCESSIVE APPROXIMATION REGISTER (SAR) ANALOG-TO-DIGITAL CONVERTER (ADC) TIMING ADJUSTMENT BASED ON OUTPUT STATISTICS

TECHNICAL FIELD

This disclosure relates to an electronic device comprising an asynchronous successive approximation register (SAR) analog-to-digital converter (ADC) that implements timing adjustment based on output statistics.

BACKGROUND

A successive approximation register (SAR) analog-to-digital converter (ADC) converts an analog voltage into a discrete digital representation of the analog voltage. Generally, a SAR ADC implements a number of asynchronous conversion loops to convert the analog voltage to its digital representation. SAR ADC topologies are becoming increasingly popular for high speed technologies, such as high speed Serializer-Deserializer (SerDes) circuits. These SAR ADC topologies can be easily scaled with advanced processing technology.

SUMMARY

Some examples described herein relate to electronic devices that include an asynchronous successive approximation register (SAR) analog-to-digital converter (ADC) that implements timing adjustment based on output statistics. Generally, a statistics monitor and an operation setting circuit are implemented with an asynchronous SAR ADC in an electronic device. The statistics monitor can monitor output data output from the SAR ADC and can responsively set an operational setting based on the output data. The operation setting circuit sets an operating condition of the asynchronous SAR ADC based on the operational setting. Some examples can be implemented as a low overhead solution in the asynchronous SAR ADC and can decrease error rates of data (such as caused by metastability events of the asynchronous SAR ADC) output by the asynchronous SAR ADC.

In an example, an electronic device includes an asynchronous SAR ADC, a statistics monitor, and an operation setting circuit. The asynchronous SAR ADC is configured to output output data. The statistics monitor is configured to capture samples at a bit position of the output data. The statistics monitor is further configured to generate an operational setting based on the captured samples. The operation setting circuit is configured to adjust an operating condition of the asynchronous SAR ADC based on the operational setting.

An example is a method for operating an electronic device. Samples of a bit position of data output by an asynchronous SAR ADC are captured by a statistics monitor. A distribution of a given value in the captured samples is determined by the statistics monitor. An operational setting is generated, by the statistics monitor, based on the distribution. An operating condition of the asynchronous SAR ADC is controlled, by an operation setting circuit, based on the operational setting.

In an example, an electronic device includes an asynchronous SAR ADC, a statistics monitor, and an operation setting circuit. The asynchronous SAR ADC includes a comparator. The asynchronous SAR ADC is configured to resolve bit positions of digital data for a respective sampling period successively. The asynchronous SAR ADC is configured to output the digital data on an output node of the asynchronous SAR ADC. The statistics monitor is electrically coupled to the output node of the asynchronous SAR ADC and is configured to capture samples of a last bit position of the digital data that the asynchronous SAR ADC is configured to resolve last for a respective sampling period and that is output by the asynchronous SAR ADC on the output node of the asynchronous SAR ADC. The statistics monitor is further configured to generate an operational setting based on a distribution of a value in the captured samples. The operation setting circuit is configured to adjust an operating condition of the comparator, based on the operational setting, to reduce a likelihood that a metastability event of the comparator prevents data of each bit position of the digital data from being resolved during a respective sampling period.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
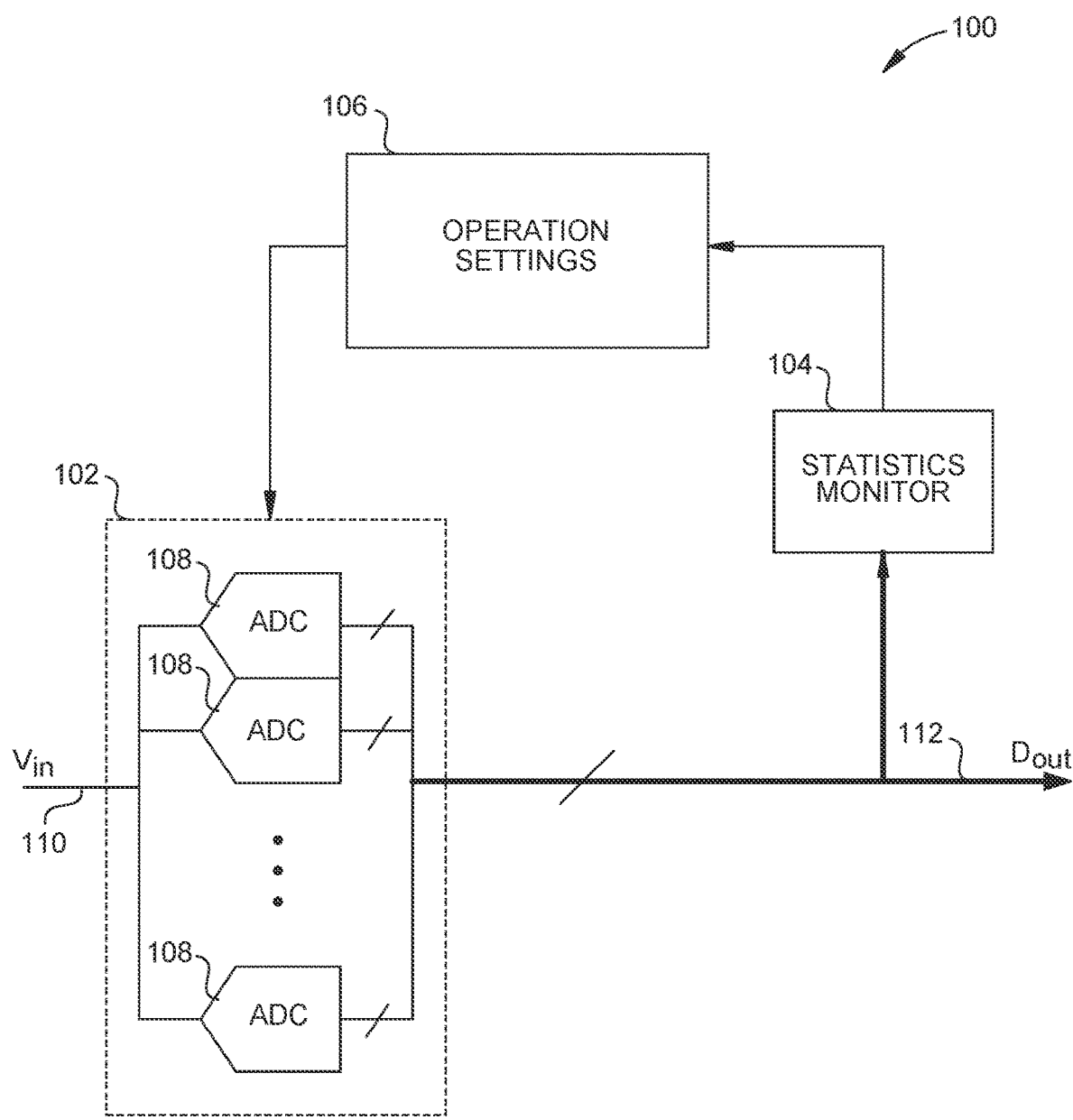
FIG. 1 is a block diagram of a timing adjustable asynchronous successive approximation register (SAR) analog-to-digital converter (ADC) according to some examples.

Some examples described herein relate to electronic devices that include an asynchronous successive approximation register (SAR) analog-to-digital converter (ADC)

that implements timing adjustment based on output statistics. Generally, a statistics monitor and an operation setting circuit are implemented with an asynchronous SAR ADC in an electronic device. The statistics monitor can monitor output data output from the SAR ADC and can responsively set an operational setting based on the output data. The operation setting circuit sets an operating condition of the asynchronous SAR ADC based on the operational setting, which can adjust the operating condition.

Generally, a comparator of the asynchronous SAR ADC can incur metastability events, which can prevent respective values of one or more bit positions of the output data from being resolved. The statistics monitor can capture samples at a bit position of the output data, where the bit position is the last bit position to be resolved by the asynchronous SAR ADC in a respective sampling period, in some examples. In other examples, the statistics monitor can capture samples at another and/or an additional one or more bit positions of the output data. The statistics monitor can generate the operational setting based on the captured samples, such as when a number of a given value (e.g., a logical "1" or logical "0") of the captured samples is not within an error range of half of the captured samples. The operational setting, and the operation setting circuit, can implement an operating condition of the asynchronous SAR ADC that reduces a likelihood that a metastability event of the comparator of the asynchronous SAR ADC prevents data of each bit position of the output data from being resolved during a respective sampling period. Examples of an operating condition include a time for a reset window during a sampling period, a supply voltage level of the asynchronous SAR ADC, or other parameters that can affect a comparator decision window during a sampling period. Some examples can be implemented as a low overhead solution in the asynchronous SAR ADC and can decrease error rates of data output by the asynchronous SAR ADC. Some examples can address a balance between decreased error rates of data and power consumption, noise, and performance of the asynchronous SAR ADC.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed subject matter or as a limitation on the scope of the claimed subject matter. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

In the description that follows, various signals or data are described in the context of the operation of various circuits. A described signal or data indicates a corresponding node on which the signal or data is applied or propagated and further indicates nodes that are communicatively coupled and/or electrically connected. For example, description of a signal or data output from a first circuit and input to a second circuit indicates an output node of the first circuit (on which the signal or data is output from the first circuit) is communicatively coupled and/or electrically connected to an input node of the second circuit (on which the signal or data is input to the second circuit). Explicit description of such nodes may be omitted in the following description, but a person having ordinary skill in the art will readily understand the presence of the nodes.

FIG. 1 is a block diagram of a timing adjustable asynchronous SAR ADC 100 according to some examples. The timing adjustable asynchronous SAR ADC 100 includes an asynchronous SAR ADC 102, a statistics monitor 104, and an operation setting circuit 106. The asynchronous SAR ADC 102 can include one or more asynchronous SAR ADC slices 108, and when multiple asynchronous SAR ADC slices 108 are implemented, such as in a time-interleaved SAR ADC architecture like illustrated, the asynchronous SAR ADC slices 108 are connected in parallel between an input node 110 and an output node 112. Generally, the asynchronous SAR ADC slice(s) 108 receives an input voltage (Vin) on the input node 110 and converts the input voltage (Vin) to digital data (Dout) that is output on the output node 112. The asynchronous SAR ADC slices 108 can be time interleaved to increase throughput of the timing adjustable asynchronous SAR ADC 100.

The statistics monitor 104 is communicatively coupled to the output node 112 to capture samples at one or more bit positions of the digital data (Dout) on the output node 112. The statistics monitor 104 is configured to generate a statistic corresponding to a respective bit position of the output node 112. The statistics monitor 104 is configured to generate an operational setting based on the statistic. The statistics monitor 104 is communicatively coupled to the operation setting circuit 106. The statistics monitor 104 is configured to output the operational setting to the operation setting circuit 106. The operation setting circuit 106 is configured to control an operating condition of the asynchronous SAR ADC slice(s) 108 based on the operational setting received from the statistics monitor 104.

Generally, metastability of an asynchronous SAR ADC slice 108 can cause data at one or more bit positions of data output by that asynchronous SAR ADC slice 108 to not be resolved within a sampling period. If data is not resolved within the sampling period, the data that is output can be incorrect. To determine whether metastability events have likely caused errors in the data that is output from an asynchronous SAR ADC slice 108, a statistically significant sample size of data for a corresponding bit position of the data that is output can be captured. For a statistically significant sample size, it is assumed that the data represented by the input voltage is random such that half of the data captured at the bit position should be a logical "0" and the other half should be a logical "1". This assumption is commonly observed in practice, such as in serializer-deserializer (SerDes) applications and in the presence of noise. When the data that is captured varies from within an error range of this fifty percent probability presumption (e.g., more captured samples being the reset value of the bit position), then it can be assumed that the asynchronous SAR ADC slice 108 does not operate with sufficient timing to resolve data at the bit position due to metastability. Hence, the statistics monitor 104 and the operation setting circuit 106 operate to control an operational setting to permit the asynchronous SAR ADC slice 108 to more likely be able to resolve data of that bit position.

For example, a power supply voltage can be increased to increase a speed of the asynchronous SAR ADC slice 108 such that the data is more likely to be resolved. As another example, a comparator reset window for resetting a comparator of the asynchronous SAR ADC slice 108 can be reduced to increase a comparator decision time of that comparator, which permits more time to resolve the data. In some examples, the ability to resolve data can be balanced with speed, power consumption, noise, and analog performance of the asynchronous SAR ADC slice 108 to obtain an operating condition that reduces data errors while having reduced power consumption and noise and having increased speed and analog performance.

In some examples, the statistics monitor 104 can be, be part of, or include a processor (e.g., a digital signal processor (DSP)) that includes a non-transitory storage medium (e.g., memory, such as static random access memory (SRAM), dynamic random access memory (DRAM), non-volatile memory, or the like) that stores instruction code that the processor is configured to execute. The execution of the instruction code by the processor can implement functionality described herein. In some examples, the statistics monitor 104 can be or include a state machine or other logic configured to implement functionality described herein.

Some examples of the operation setting circuit 106 are described below. The operation setting circuit 106 can be any circuit configured to implement an operational setting. Generally, the operation setting circuit 106 can implement an operational setting to adjust or implement an operating condition of one or more of the asynchronous SAR ADC slice(s) 108 that is capable of reducing the likelihood that data for each bit position of data to be output from the respective asynchronous SAR ADC slice 108 is not resolved within a respective sampling period.

The timing adjustable asynchronous SAR ADC 100 can be implemented in a high speed SerDes, as an example. Multiple asynchronous SAR ADC slices 108 can be time-interleaved to achieve a high aggregate sampling rate, such as greater than 50 Gbps. The timing adjustable asynchronous SAR ADC 100 can be implemented can be implemented in other circuits and/or as a stand-alone IP block.

Figure 2:
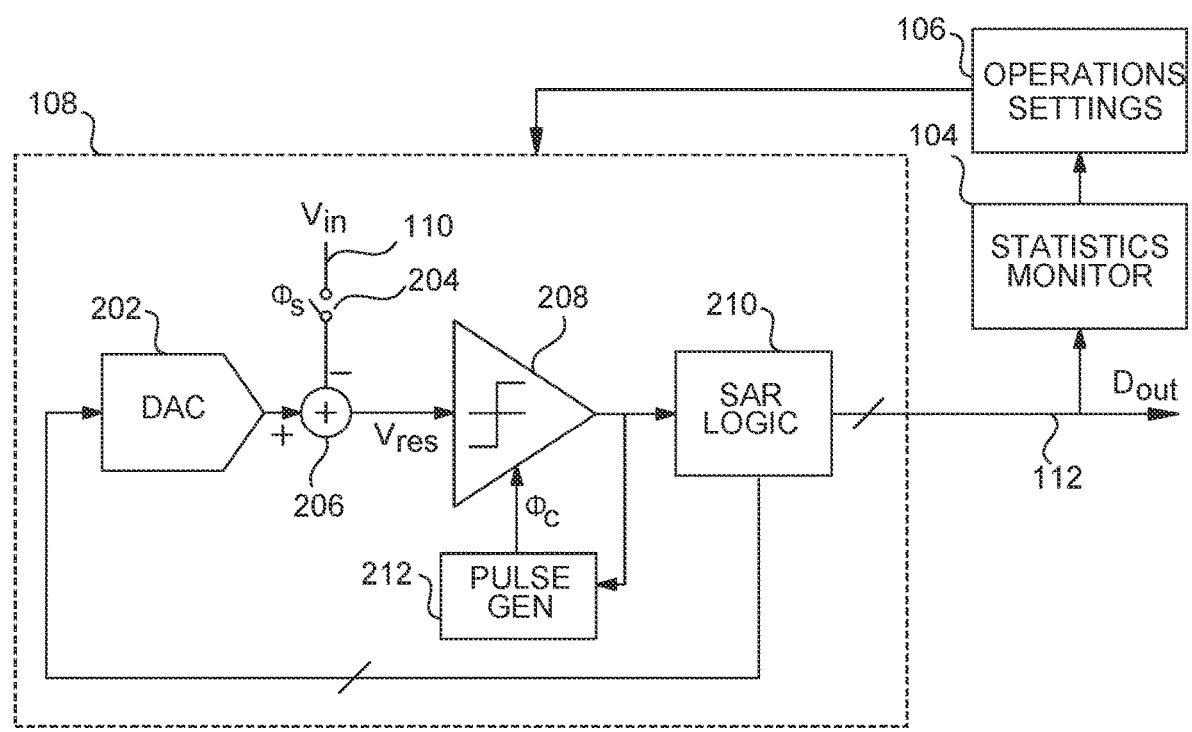
FIG. 2 is a simplified circuit schematic of an asynchronous SAR ADC slice according to some examples.

FIG. 2 illustrates a simplified circuit schematic of an asynchronous SAR ADC slice 108 according to some examples. The asynchronous SAR ADC slice 108 includes a digital-to-analog converter (DAC) 202, a switch 204, a summing circuit 206, a comparator 208, SAR logic 210, and a pulse generator circuit 212. The topology and operation of the asynchronous SAR ADC slice 108 is provided herein as an example. Other topologies and corresponding operations can be implemented in other examples. A person having ordinary skill in the art will readily understand the applicability of aspects described herein to other topologies of asynchronous SAR ADCs.

The switch 204 is electrically connected between the input node 110 and a negative or inverting input node of the summing circuit 206. A sampling control signal ($\Phi_s$) controls whether the switch 204 is in an open state or a closed state. The DAC 202 has an input node electrically connected to an intermediate output node of the SAR logic 210, and has an output node electrically connected to a positive or non-inverting input node of the summing circuit 206. An output node of the summing circuit 206 is electrically connected to an input node of the comparator 208. Generally, the switch 204 is configured to be in a closed state when the sampling control signal ($\Phi_s$) is logically high, and the summing circuit 206 samples and holds the input voltage (Vin) on the input node 110 via the switch 204. The switch 204 is configured to be in an open state when the sampling control signal ($\Phi_s$) is logically low, which decouples the summing circuit 206 from the input node 110. The DAC 202 is configured to convert received digital data to an analog voltage and output the analog voltage to the summing circuit 206. The digital data that the DAC 202 is configured to convert is latched in a capture register of the SAR logic 210 and communicated to the DAC 202 via the intermediate output node of the SAR logic 02. The summing circuit 206 is configured to subtract the sampled and held input voltage (Vin) from the analog voltage output by the DAC 202 to generate a resulting residue voltage (Vres). The summing circuit 206 is configured to output the residue voltage (Vres) to the comparator 208.

An output node of the comparator 208 is electrically connected to an input node of the SAR logic 210 and an input node of the pulse generator circuit 212. An output node of the pulse generator circuit 212 is electrically connected to a control input node of the comparator 208. The comparator 208 is configured to be in a state to resolve data when a comparator control signal ($\Phi_c$) is logically high and to be in a reset state when the comparator control signal ($\Phi_c$) is logically low. In a state to resolve data, the comparator 208 is configured to resolve a difference between the analog residue voltage (Vres) and a reference voltage and to responsively output a logical "1" or a logical "0" based on that difference. The reference voltage can be an analog voltage input into the comparator 208 or can be a voltage implicit in the comparator 208 based on a circuit configuration of the comparator 208. The pulse generator circuit 212 is configured to generate the comparator control signal ($\Phi_c$). The pulse generator circuit 212 is configured to set the comparator control signal ($\Phi_c$) to logically low during an initial window of a sampling period (e.g., which may be some pre-set time) and to transition the comparator control signal ($\Phi_c$) to logically high after that initial window. The pulse generator circuit 212 is configured to detect when the comparator 208 has resolved whether the output of the comparator 208 is a logical "0" or logical "1" (e.g., made a decision) and to responsively transition the comparator control signal ($\Phi_c$) to logically low when the pulse generator circuit 212 determines that the comparator 202 has resolved the output of the comparator 208. The pulse generator circuit 212 is further configured to maintain the comparator control signal ($\Phi_c$) in a logically low state for some comparator reset window before transitioning the comparator control signal ($\Phi_c$) to logically high.

The SAR logic 210 includes routing logic and a capture register. The capture register includes latches, where each latch corresponds to a bit position of the data to be output from the asynchronous SAR ADC slice 108. The routing logic is configured to route data output by the comparator 208 to a corresponding latch for data of a bit position. The corresponding latch of the capture register is configured to capture and latch the data. The SAR logic 210 is configured to output the data captured by the by the capture register to the DAC 202 via the intermediate output node. In some examples, the SAR logic 210 can include an output register, and the SAR logic 210 can be configured to transfer data from the capture register at a conclusion of a sampling period to the output register, where the data is stored and output during a subsequent sampling period. A data output node of the SAR logic 210, such as an output node of the output register, is the output node 112. The SAR logic 210 can also include logic to reset the capture register to some pre-determined data or value at the conclusion or beginning of a sampling period.

Figure 3:
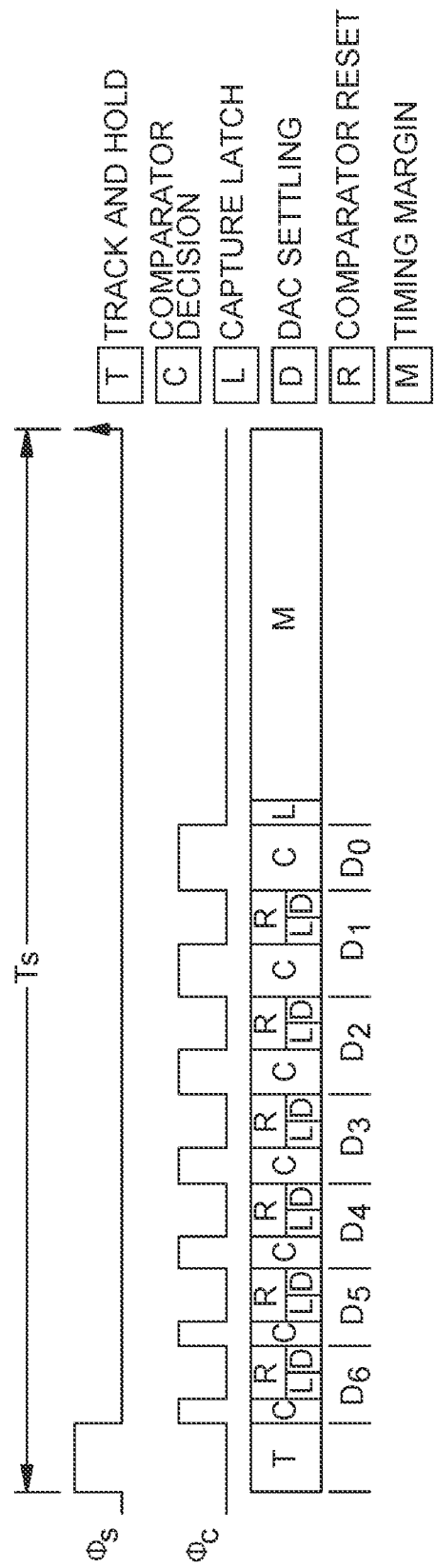
FIG. 3 is an example timing diagram of an operation of the asynchronous SAR ADC slice of FIG. 2 according to some examples.

FIG. 3 is an example timing diagram of an operation of the asynchronous SAR ADC slice 108 of FIG. 2 according to some examples. The timing diagram shows a sampling period ($T_S$) for converting an analog input voltage (Vin) on the input node 110 to seven bit output data by corresponding seven bit position cycles ($D_{6:0}$). Although described herein as seven bit output data, the data can have any number of bits, and correspondingly, any number of cycles can be implemented by the asynchronous SAR ADC slice 108 to resolve bit positions of the output data.

When the sampling control signal ($\Phi_s$) is logically high at a track and hold window (T) of the sampling period ($T_S$), the switch 204 is in a closed state, and the input voltage (Vin) is sampled and held at the summing circuit 206. Additionally, during the track and hold window (T), the capture register of the SAR logic 210 is reset to pre-determined data. In some examples, each bit position of the capture register can be reset to a logical "0", and in other examples, each bit position of the capture register can be reset to a logical "1". Throughout the sampling period ($T_S$), the summing circuit 206 is configured to subtract the held input voltage (Vin) from an analog voltage output from the DAC 202 and output the resulting voltage as an analog residue voltage (Vres) to the comparator 208. The analog voltage output from the DAC 202 can vary during the sampling period ($T_S$) as data in the capture register of the SAR logic 210 is changed.

At the conclusion of the track and hold window (T), the sampling control signal ($\Phi_s$) transitions to logically low, which causes the switch 204 to be in an open state and to remain logically low throughout the remainder of the sampling period ($T_S$). Also, at the conclusion of the track and hold window (T), the data of successive bit positions of the output data are attempted to be resolved. In the illustrated example, data for the most significant bit (MSB) (e.g., corresponding to bit position cycle ($D_6$)) is attempted to be resolved first through successive bit positions to the least significant bit (LSB) (e.g., corresponding to bit position cycle ($D_0$)). Each bit position cycle ($D_x$), except for the LSB cycle ($D_0$), includes a comparator decision window (C), a capture latch window (L), a DAC settling window (D), and a comparator reset window (R). The LSB cycle ($D_0$) includes a comparator decision window (C) and a capture latch window (L). A DAC settling window (D) and a comparator reset window (R) may occur as part of a subsequent timing margin (M) or a track and hold window (T) of a subsequent sampling period.

For a bit position cycle ($D_x$), the respective comparator decision window (C) is performed before the respective capture latch window (L), and where appropriate, the respective capture latch window (L) is performed before the respective DAC settling window (D). The respective comparator reset window (R) is performed asynchronously with the respective capture latch window (L) and DAC settling window (D). The bit position cycles ($D_x$) are generally self-timed in the asynchronous SAR ADC slice 108.

A comparator decision window (C) occurs when the comparator control signal ($\Phi_c$) output by the pulse generator circuit 212 and input on the control input node of the comparator 208 is logically high. When the comparator control signal ($\Phi_c$) is logically high, the comparator 208 is enabled to resolve a difference between the analog residue voltage (Vres) and a reference voltage and to responsively output a logical "1" or a logical "0" based on that difference.

A capture latch window (L) occurs when the comparator control signal ($\Phi_c$) transitions to logically low. The SAR logic 210 routes the logical "0" or "1" output by the comparator 208 to a respective latch (e.g., corresponding to the bit position of the bit position cycle ($D_x$)) of the capture register, which captures the logical "0" or "1" output by the comparator 208. A DAC settling window (D) occurs subsequent to the capture latch window (L) to permit the DAC 202 to settle the analog voltage output to the summing circuit 206 based on any change to the digital data stored in the register of the SAR logic 210 and output to the DAC 202. A comparator reset window (R) occurs when the comparator control signal ($\Phi_c$) is logically low and causes the comparator 208 to be reset. Generally, the comparator reset window (R) should be sufficiently long for the capture latch window (L) and DAC settling window (D) to permit sufficient settling of the DAC 202. Insufficient settling of the DAC 202 can cause inaccurate resolution of a subsequent bit position cycle.

The timing margin (M) of the sampling period ($T_S$) can be determined based on the timing of windows that occur during the sampling period ($T_S$). The time ($T_M$) for the timing margin (M) is generally the time of the sampling period ($T_S$) available for difficulty resolving data for one or more bit positions by the comparator 208. In the example illustrated in FIG. 2 and based on FIG. 3, the time ($T_M$) for the timing margin (M) can be represented as:

$$T_S = T_T + T_{EASY} + [(B-1) \times \max\{T_R, (T_L + T_D)\}] + T_L + T_M$$

$$T_M = T_S - T_T - T_{EASY} - [(B-1) \times \max\{T_R, (T_L + T_D)\}] - T_L$$

$T_S$ is the sampling period. $T_T$ is the time for tracking and sampling the input voltage (Vin) and corresponds to the track and hold window (T). $T_T$ can be a fixed time based on the analog tracking performance. B is the number of bit positions in the data to be resolved and output by the asynchronous SAR ADC slice 108. $T_R$ is the time for generating a reset signal (e.g., the comparator control signal ($\Phi_c$)) by the pulse generator circuit 212 (including detection of the decision by the comparator 208) and for resetting the comparator 208. $T_R$ corresponds to the comparator reset window (R). $T_R$ can be a tunable time and can be an amount of time that permits sufficient time to reset the comparator 208 to remove memory effects and to allow the DAC 202 to settle. $T_L$ is the time for routing the logical "0" or "1" output by the comparator 208 to a corresponding latch of the capture register in the SAR logic 210, capturing that logical "0" or "1" by the latch, and outputting the data of the capture register to the DAC 202. $T_L$ corresponds to the capture latch window (L). $T_D$ is the time for settling of the analog voltage output by the DAC 202 and corresponds to the DAC settling window (D).

$T_{EASY}$ is the cumulative time of a sampling period ($T_S$) for the comparator 208 to resolve data when the corresponding decision is easy, such as when the residue voltage (Vres) is at a level where the comparator 208 can resolve the data to be output without incurring a metastability event of the comparator 208. The comparator 208 has a comparator evaluation time ($T_C$) that corresponds to the comparator decision window (C). The comparator evaluation time ($T_C$) includes a clock-to-q delay and a regenerative time delay. The regenerative time delay is dependent on the residue voltage (Vres) that is input to the comparator 208. If a magnitude of a difference between the residue voltage (Vres) and the reference voltage is large, the regenerative time delay can be small (e.g., without incurring metastability of the comparator 208). If a magnitude of a difference between the residue voltage (Vres) and the reference voltage is small, the regenerative time delay can be large, which may implicate metastability of the comparator 208. For a given sampling period ($T_S$) and bit position cycles ($D_x$) of that sampling period ($T_S$) where the comparison decision is easy, $T_{EASY}$ is the sum of comparator evaluation time ($T_C$) for those bit position cycles ($D_x$).

For a sampling period ($T_S$), a difficult decision by the comparator 208 may occur for one or more of the bit position cycles ($D_x$). The occurrence of a metastability event in the asynchronous SAR ADC slice 108 is a probabilistic process that is dependent upon the input voltage (Vin). In a sampling period ($T_S$), when a difficult decision by the comparator 208 occurs for a bit position cycle ($D_i$), the data for the bit position corresponding to that bit position cycle ($D_i$) and for any bit position(s) corresponding to successive bit position cycle(s) ($D_{(i-1):0}$) may not be correctly resolved and/or captured by the capture register, and hence, may be errors.

If, in the illustrated example of FIGS. 2 and 3, the time for the comparator 208 to perform a difficult decision (e.g., incurs a metastability event) during a bit position cycle ($D_i$) is greater than the time $T_M$, then the data for at least the bit position corresponding to the bit position cycle ($D_0$) generally will not be captured by the corresponding latch. Further, if the time for the comparator 208 to perform a difficult decision (e.g., incurs a metastability event) during a bit position cycle ($D_i$) is greater than the remaining time of the sampling period ($T_S$), then the data for the bit positions corresponding to the bit position cycles ($D_{i:0}$) generally will not be resolved and/or captured by the corresponding latch. Hence, in the illustrated example, the data for the bit position corresponding to the bit position cycle ($D_0$) (e.g., the LSB of the data) has the highest likelihood (e.g., relative to other bit positions of the output data) of being an error due to a metastability event. In the illustrated example, a metastability event that occurs in a cycle preceding a lower bit position cycle can result in an error in the bit position corresponding to that lower bit position cycle, whereas a metastability event that occurs in a cycle subsequent to a higher bit position cycle does not affect the data of that higher bit position cycle.

According to some examples, data of a bit position of the output data that has a highest likelihood of being an error due to a metastability event is monitored by the statistics monitor 104. In some examples, this bit position corresponds to a bit position cycle ($D_x$) that the asynchronous SAR ADC slice 108 is configured to resolve last during a respective sampling period ($T_S$). Continuing the above description in the context of the illustrated example, the data of the LSB of the output data is monitored. In a statistically significant sample size based on the randomness assumption described above, it is assumed that half of the samples of the LSB should be a logical "1", while the other half of the samples should be a logical "0". Generally, there are assumed to be three scenarios concerning the data of the LSB: (1) that the latch of the capture register correctly captured a logical "1", (2) that the latch of the capture register correctly captured a logical "0", and (3) that the latch of the capture register did not capture data because a metastability event caused the sampling period ($T_S$) to conclude before the latch could capture resolved data. Under scenario (3), the data in the latch would remain the reset value that the latch was reset to at the beginning of the sampling period ($T_S$). Hence, any deviation from half of the samples being logical "1" (or vice versa, from being logical "0") indicates that scenario (3) has occurred in the generation of the captured samples. As an example, if the LSB of the capture register is reset to a logical "0" for each sampling period ($T_S$) and 10% of the samples were errors, 90% of the samples that are correct data would be expected to be half logical "1"s and half logical "0"s, while the 10% that are errors would be expected to be logical "0"s due to the reset value being logical "0". This would result in 55% of the samples being logical "0"s (e.g., 0.5×0.9 for the correct samples and 0.1 for the errors) and 45% of the samples being logical "1"s. Hence, the deviation from 50% of logical "1"s and 50% of logical "0"s indicates errors as a result of hard decisions and/or metastability events.

The statistics monitor 104 is configured to detect a deviation when a distribution of captured logical "1"s or "0"s are not equally distributed (e.g., each being half of the captured samples). In some examples, the statistics monitor 104 can be configured to detect a deviation when the distribution of the number of captured logical "1"s is outside of some error range (e.g., 0.1%, 1%, 5%, 10%, etc. of the total number of captured samples) of half the total number of captured samples. For example, if the error range is 1%, if the number of captured logical "1"s is outside of the range of 49% to 51%, the statistics monitor 104 can detect a deviation.

The statistics monitor 104, in response to detecting a deviation, can cause the operation setting circuit 106 to change some setting to reduce a likelihood that a metastability event will impact resolving the data to be output. As an example, the operation setting circuit 106 can cause a reset time control setting to change a duration of a comparator reset window (R). A comparator reset window (R) can be shortened to increase a time ($T_M$) for a timing margin (M), which can increase the time available for difficult decisions that can be incurred due to metastability. The increased available time can increase the likelihood that data is resolved during the sampling period ($T_S$). As another example, the operation setting circuit 106 can cause a supply control signal to change a supply voltage of the asynchronous SAR ADC slice 108, including a supply voltage of the comparator 208. The ability of the comparator 208 to resolve small differences can be increased by increasing the supply voltage of the comparator 208, which can increase the speed of the comparator 208. Hence, the comparator 208 can resolve data more quickly to increase the likelihood that data is resolved during the sampling period ($T_S$). Additionally, increasing the supply voltage to other components of the asynchronous SAR ADC slice 108 increase the speed and reduce the delay of those components, such as the SAR logic 210. In some examples, the components of the asynchronous SAR ADC slice 108 (including the DAC 202, summing circuit 206, comparator 208, SAR logic 210, and pulse generator circuit 212) are electrically connected to a same power supply node and receive the same supply voltage.

In addition, the statistics monitor 104 can consider operation characteristics when determining settings for the operation setting circuit 106. For example, if the time for the comparator reset window (R) is subject to change, the statistics monitor 104 may consider the time for the capture latch window (L) and DAC settling window (D). If the time for the comparator reset window (R) is decreased to too small amount, the capture latch window (L) and DAC settling window (D) may not have sufficient time for the DAC 202 to settle, which can cause errors in the output data. Hence, the statistics monitor 104 may be configured to reduce the time for the comparator reset window (R) to a duration that permits the DAC 202 to settle. As another example, if the supply voltage is subject to change, increasing the supply voltage can cause the asynchronous SAR ADC slice 108 to consume more power. The statistics monitor 104 may be configured to increase the supply voltage to a lowest setting that achieves a target distribution of the data of the bit position that is monitored (e.g., half of the samples, plus or minus an error range, are a logical "0" or "1").

Figure 4:
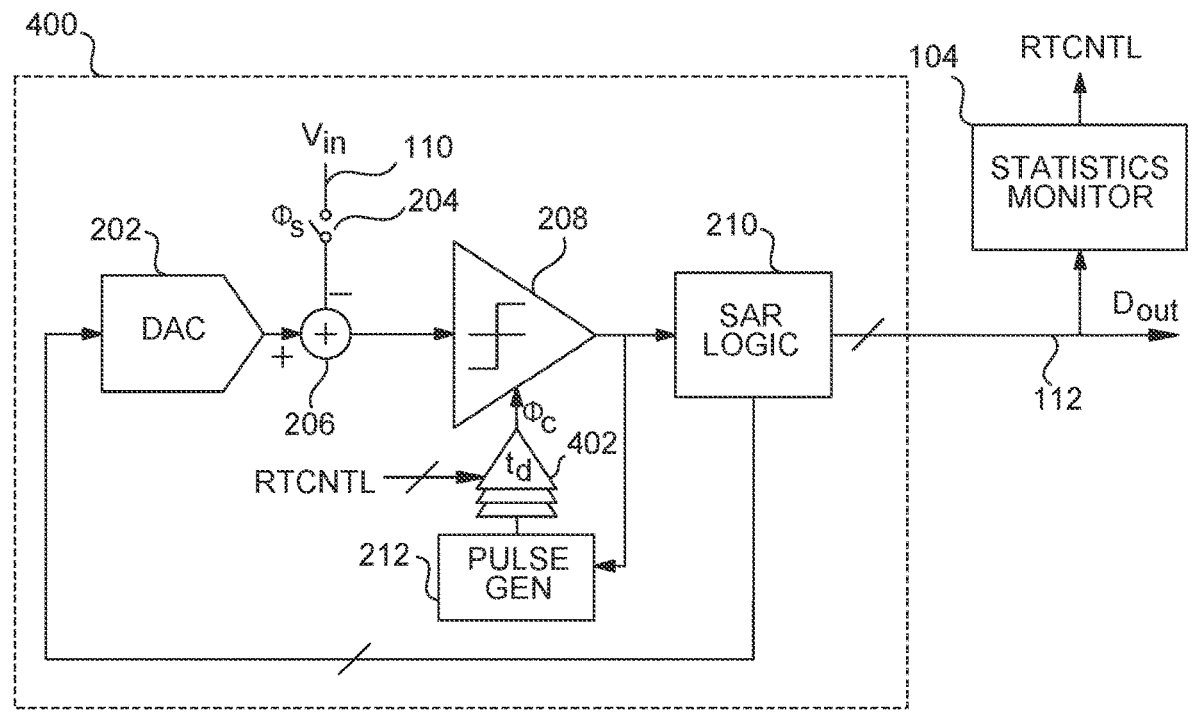
FIG. 4 is a circuit schematic of an asynchronous SAR ADC slice according to some examples.

FIG. 4 illustrates a circuit schematic of an asynchronous SAR ADC slice 400 according to some examples. The asynchronous SAR ADC slice 400 is like the asynchronous SAR ADC slice 108 of FIG. 1, except the operation setting circuit 106 is a variable delay circuit 402 in the asynchronous SAR ADC slice 400. The variable delay circuit 402 is electrically coupled between the pulse generator circuit 212 and the comparator 208 and is configured to output the comparator control signal ($\Phi_c$). The variable delay circuit 402 is configured to generate a rising edge of the comparator control signal ($\Phi_c$) with some delay time following a falling edge of the comparator control signal ($\Phi_c$), where the delay time is variable based on a reset time control setting (RTCNTL) output from the statistics monitor 104. The reset time control setting (RTCNTL) can be a multi-bit signal that selects the delay time implemented by the variable delay circuit 402. With reference to FIG. 3, the time between a falling edge and a subsequent rising edge of the comparator control signal ($\Phi_c$) corresponds to the comparator reset window (R).

In some examples, to determine the reset time control setting (RTCNTL), the statistics monitor 104 is configured to initially set the reset time control setting (RTCNTL) to a highest available setting The statistics monitor 104 is configured to then iteratively capture a statistically significant number of samples of a bit position of output data that has a highest likelihood of being an error due to a metastability event and decrease the reset time control setting (RTCNTL) until captured samples have a distribution of logical "0"s or "1"s within a predefined error range of 50% of the number of captured samples.

Figure 5:
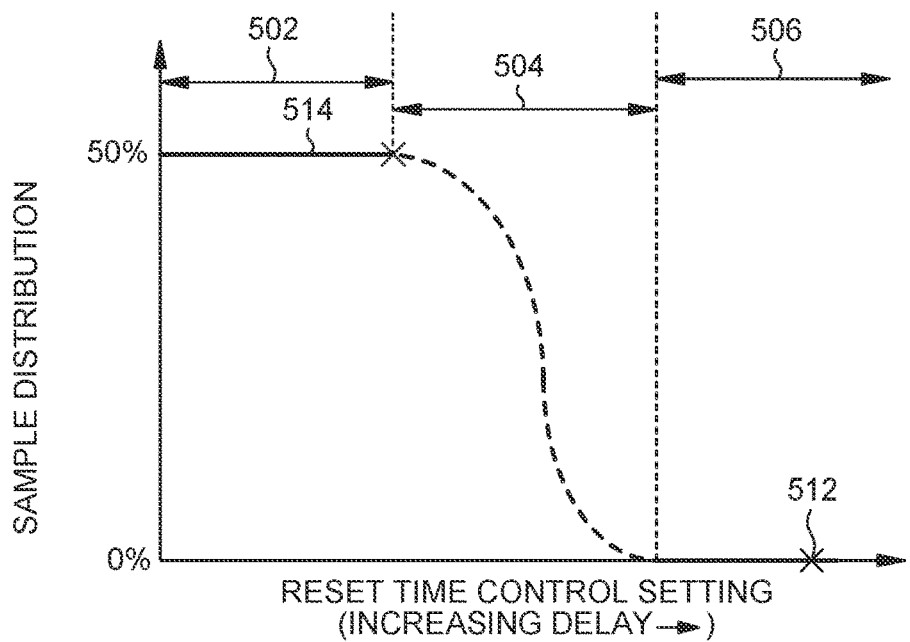
FIG. 5 is a generalized expected distribution of a captured number of samples of the asynchronous SAR ADC slice of FIG. 4 according to some examples.

FIG. 5 illustrates a generalized expected distribution of a captured number of samples according to some examples. In this example, the distribution is for the percentage of logical "1"s captured in the captured number of samples, where the LSB (as described previously) of the output data is captured. The reset value of the LSB of the capture register in this example is logical "0". The distribution is a function of the reset time control setting (RTCNTL). An increasing setting corresponds to an increasing delay, and conversely, a decreasing setting corresponds to a decreasing delay.

In FIG. 5, a first range 502 is a range of the reset time control setting (RTCNTL) where the asynchronous SAR ADC slice 108 conceptually always has sufficient time in a sampling period ($T_S$) to resolve data of the monitored bit position (e.g., the LSB). For example, a reset time control setting (RTCNTL) within the first range 502 may cause the comparator reset window (R) to be sufficiently small within the sampling period ($T_S$) to permit sufficient time for the comparator decision window (C) for bit position cycles ($D_x$) such that data for the monitored bit position is conceptually always resolved and captured. Hence, a distribution of the captured logical "1" is 50% in the first range 502, which corresponds to the fifty percent probability presumption described above. A second range 504 is a range of the reset time control setting (RTCNTL) where the asynchronous SAR ADC slice 108 conceptually sometimes has sufficient time in a sampling period ($T_S$) to resolve and capture data of the monitored bit position. The second range 504 indicates that the available time for the resolving and capturing data of the monitored bit position varies probabilistically. Due to metastability events in the second range 504, some percentage of the captured samples results from the logical "0" reset value in this example such that more logical "0"s are captured than logical "1"s. A third range 506 is a range of the reset time control setting (RTCNTL) where the asynchronous SAR ADC slice 108 conceptually never has sufficient time in a sampling period ($T_S$) to resolve and capture data of the monitored bit position. Hence, the captured samples are always the logical "0" reset value in the third range 506.

As described with respect to FIG. 4, the statistics monitor 104 can initially set the reset time control setting (RTCNTL) to have a setting 512 corresponding to a largest delay. At the setting 512, the delay implemented by the variable delay circuit 402 is so large that the LSB of the output data is not resolved and captured, according to FIG. 5. The statistics monitor 104 incrementally decreases the reset time control setting (RTCNTL) until setting 514 is reached. At setting 514, the distribution of captured samples is approximately 50% logical "1"s. The setting 514 also corresponds to the setting with a greatest delay that achieves the distribution of logical "1"s being 50%. This permits a balance between addressing metastability events of the comparator 208 and settling of the DAC 202. The greater the delay implemented by the variable delay circuit 402 is (e.g., the greater the comparator reset window (R) is), the more time that the DAC 202 has to settle in the DAC settling window (D).

Figure 6:
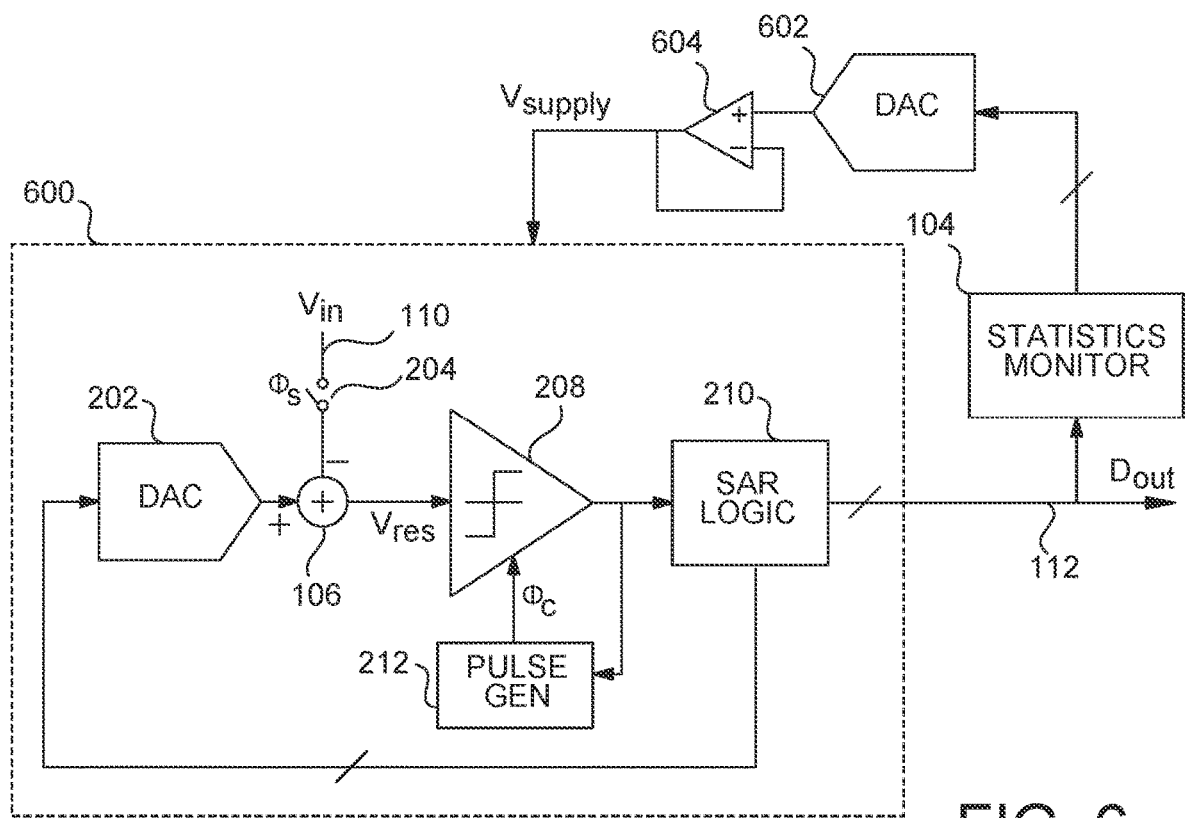
FIG. 6 is a circuit schematic of an asynchronous SAR ADC slice according to some examples.

FIG. 6 illustrates a circuit schematic of an asynchronous SAR ADC slice 600 according to some examples. The asynchronous SAR ADC slice 600 is like the asynchronous SAR ADC slice 108 of FIG. 1, except the operation setting circuit 106 is a variable power supply regulator in the asynchronous SAR ADC slice 600. The variable power supply regulator includes a DAC 602 and an op-amp 604. An input node of the DAC 602 is electrically coupled to an output node of the statistics monitor 104 to receive a supply voltage setting, which can be a multi-bit digital value. The DAC 602 is configured to convert the supply voltage setting to an analog voltage output on an output node of the DAC 602. An output node of the DAC 602 is electrically connected to a non-inverting input node of the op-amp 604. An output node of the op-amp 604 is electrically connected to an inverting input node of the op-amp 604. The output node of the op-amp 604 is a power supply node, on which a supply voltage (Vsupply) is applied, for the components of the asynchronous SAR ADC slice 600 (e.g., the DAC 202, summing circuit 206, comparator 208, SAR logic 210, and pulse generator circuit 212). For a sufficiently large DC gain of the op-amp, in operation, the supply voltage (Vsupply) on output node of the op-amp 604 (e.g., the voltage on the power supply node) is approximately equal to the voltage output by the DAC 602. Hence, the supply voltage setting provided by the statistics monitor 104 can control the supply voltage (Vsupply) on the power supply node of the asynchronous SAR ADC slice 600. In some instances, lowering the supply voltage (Vsupply) can affect the speed of each circuit component connected to the power supply node, which can adversely affect the delay of those circuit components and the ability of the asynchronous SAR ADC slice 600 to resolve and capture data. Other variable power supply regulators can be implemented, and the variable power supply regulator illustrated in FIG. 6 is merely an example.

In some examples, to determine the supply voltage setting, the statistics monitor 104 is configured to initially set the supply voltage setting to a lowest available setting. The statistics monitor 104 is configured to then iteratively capture a statistically significant number of samples of a bit position of output data that has a highest likelihood of being an error due to a metastability event and increase the supply voltage setting until captured samples have a distribution of logical "0"s or "1"s within a predefined error range of 50% of the number of captured samples.

Figure 7:
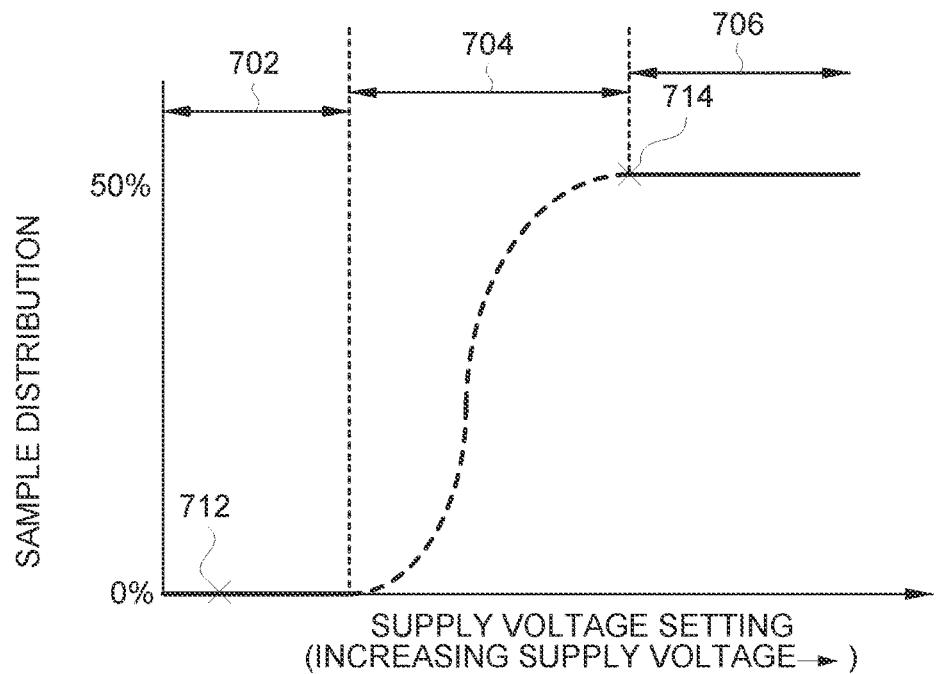
FIG. 7 is a generalized expected distribution of a captured number of samples of the asynchronous SAR ADC slice of FIG. 6 according to some examples.

FIG. 7 illustrates a generalized expected distribution of a captured number of samples according to some examples. In this example, the distribution is for the percentage of logical "1"s captured in the captured number of samples, where the LSB (as described previously) of the output data is captured. The reset value of the LSB of the capture register in this example is logical "0". The distribution is a function of the supply voltage setting. An increasing setting corresponds to an increasing supply voltage (Vsupply), and conversely, a decreasing setting corresponds to a decreasing supply voltage (Vsupply).

In FIG. 7, a first range 702 is a range of the supply voltage setting where the asynchronous SAR ADC slice 108 conceptually never has sufficient time in a sampling period ($T_S$) to resolve data of the monitored bit position (e.g., the LSB). For example, a supply voltage setting within the first range 702 may cause the comparator 208 to operate with such low speed that there is insufficient time in the sampling period ($T_S$) for the data of the monitored bit position to be resolved and captured. Hence, the captured samples are always the logical "0" reset value in the first range 702. A second range 704 is a range of the supply voltage setting where the asynchronous SAR ADC slice 108 conceptually sometimes has sufficient time in a sampling period ($T_S$) to resolve and capture data of the monitored bit position. The second range 704 indicates that the available time for the resolving and capturing data of the monitored bit position varies probabilistically. Due to metastability events in the second range 704, some percentage of the captured samples results from the logical "0" reset value in this example such that more logical "0"s are captured than logical "1"s. A third range 706 is a range of the supply voltage setting where asynchronous SAR ADC slice 108 conceptually always has sufficient time in a sampling period ($T_S$) to resolve and capture data of the monitored bit position. Hence, a distribution of the captured logical "1" is 50% in the third range 706, which corresponds to the fifty percent probability presumption described above.

As described with respect to FIG. 6, the statistics monitor 104 can initially set the supply voltage setting to have a setting 712 corresponding to a smallest available supply voltage (Vsupply). At the setting 712, the supply voltage implemented by the power supply regulator is so small that the LSB of the output data is not resolved and captured, according to FIG. 7. The statistics monitor 104 incrementally increases the supply voltage setting until setting 714 is reached. At setting 714, the distribution of captured samples is approximately 50% logical "1"s. The setting 714 also corresponds to the setting with a smallest supply voltage (Vsupply) that achieves the distribution of logical "1"s being approximately 50%. This permits a balance between addressing metastability events of the comparator 208 and power consumption of the asynchronous SAR ADC slice 600. The greater the supply voltage (Vsupply) implemented by the power supply regulator is, the more power is consumed by the asynchronous SAR ADC slice 600.

The above specific examples are described to convey aspects of more general examples. A person having ordinary skill in the art will readily envision other examples and modifications to the preceding description for those examples. For example, different reset values can be implemented, which can change the distributions shown in FIGS. 5 and 7. Additionally, the distributions shown in FIGS. 5 and 7 may be conceptual and generalized. These distributions may not be what is achieved by various example implementations. Different bit positions of the output data can be monitored instead of or in addition to the example bit positions described above. Further, different data can be monitored. For example, frequency domain information of the monitored bit position can be monitored to determine an operational setting.

In some examples, a timing adjustable asynchronous SAR ADC, such as shown in FIG. 1, can be implemented on a single integrated circuit (IC) die. In some examples, some circuits or blocks of a timing adjustable asynchronous SAR ADC can be implemented on a first IC die, while other circuits or blocks of the timing adjustable asynchronous SAR ADC can be implemented on one or more other IC dies. For example, the variable power supply regulator of FIG. 6 can be implemented off-chip from the remainder of the asynchronous SAR ADC slice 600 and statistics monitor 104 (which can be implemented on a same IC die) illustrated in FIG. 6.

Examples described herein can achieve a low overhead cost solution to adjust timing in an asynchronous SAR ADC such that data can be more likely resolved and captured. Some examples can implement no additional circuitry in an asynchronous SAR ADC for monitoring bit position(s) and implementing an operating condition. Some examples generally do not interfere in the design of the asynchronous SAR ADC, since the monitoring and implementing an operating condition can be outside of the asynchronous SAR ADC. A closed-loop method implemented by examples can adaptively set an operating condition of the asynchronous SAR ADC to improve performance. Generally, various examples can generate an operational setting that considers various tradeoffs in the asynchronous SAR ADC, such as speed, noise, linearity, and power consumption. Additionally, the dynamic nature of the monitoring by the statistics monitor can accommodate a number of different process, voltage, and temperature (PVT) environments.

Figure 8:
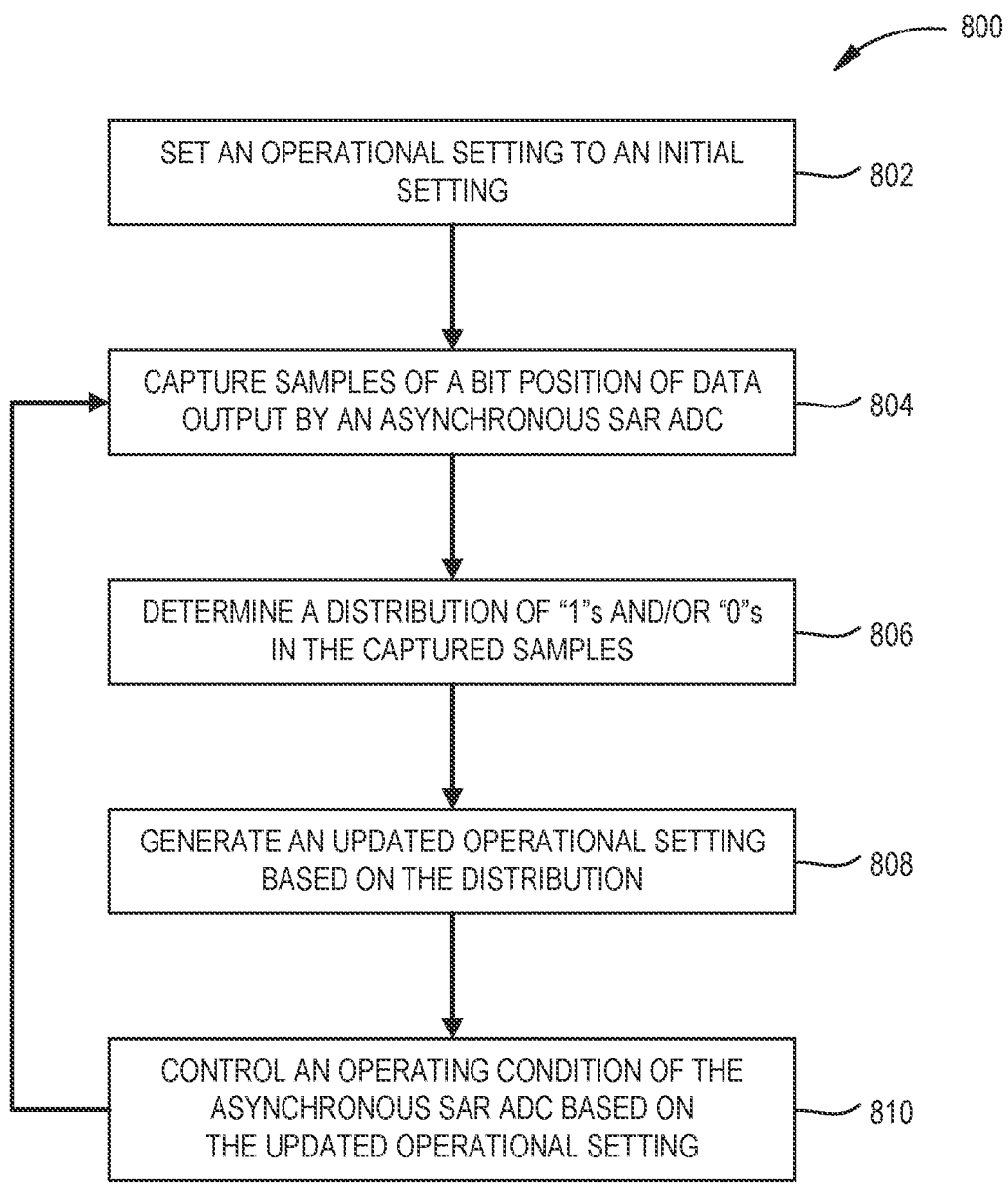
FIG. 8 is a flowchart of a method of operating an electronic device that includes a timing adjustable asynchronous SAR ADC according to some examples.

FIG. 8 is a flowchart of a method 800 of operating an electronic device that includes a timing adjustable asynchronous SAR ADC according to some examples. The timing adjustable asynchronous SAR ADC can have the architecture and circuits described above with respect to FIGS. 1, 2, 4, and/or 6, although other circuits can be implemented.

At block 802, an operational setting is set to an initial setting by a statistics monitor. The initial setting can be, for example, an appropriate lowest or highest available setting. The initial operational setting is used to initially control an operating condition of an asynchronous SAR ADC by an operation setting circuit. As described above with respect to FIG. 4, the operational setting can be a reset time control setting. As described above with respect to FIG. 6, the operational setting can be a supply voltage setting. Other operational settings can be implemented.

At block 804, samples of a bit position of data output by the asynchronous SAR ADC are captured by the statistics monitor. The samples are output by the asynchronous SAR ADC under the operating condition controlled by the operational setting. In some examples, the bit position is the bit position that the asynchronous SAR ADC is configured to resolve last in a respective sampling period, and hence, is the bit position most likely to be an error based on an occurrence of a metastability event of the asynchronous SAR ADC. In examples described above, the bit position is the LSB of the output data. Other bit positions can be monitored instead of or in addition to the bit position that is resolved last.

At block 806, a distribution of logical "1"s and/or "0"s in the captured samples is determined by the statistics monitor. At block 808, an updated operational setting is generated based on the distribution. For example, if the distribution indicates a number of logical "1"s that is not within an error range of half of the number of captured samples, the operational setting can be updated. Like described with respect to FIGS. 5 and 7, the operational setting can be increased or decreased. At block 810, the operating condition of the asynchronous SAR ADC is controlled by the operation setting circuit based on the updated operational setting. The asynchronous SAR ADC can then operate under the operating condition controlled by the updated operational setting. Blocks 804 through 810 can be repeatedly and iteratively performed to dynamically adjust the operational setting. The dynamic adjustment of the operational setting can accommodate different operating environments of the asynchronous SAR ADC.

Figure 9:
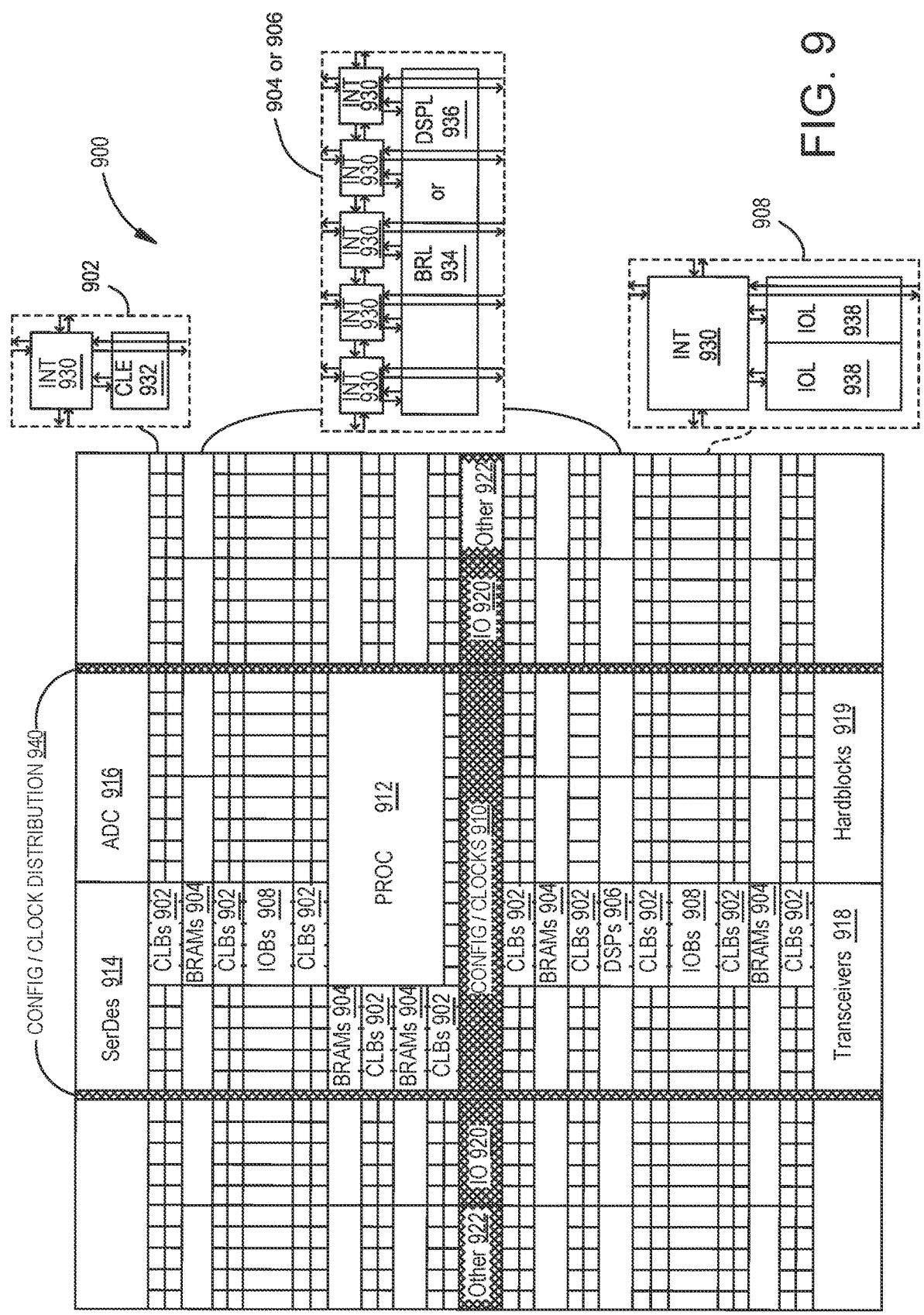
FIG. 9 illustrates a field programmable gate array (FPGA) that may be implemented as a programmable device in which a timing adjustable asynchronous SAR ADC can be implemented according to some examples.

FIG. 9 illustrates a field programmable gate array (FPGA) 900 that may be implemented as a programmable device in which a timing adjustable asynchronous SAR ADC can be implemented according to some examples. The FPGA 900 includes a large number of different programmable tiles that form a programmable fabric including configurable logic blocks (CLBs) 902, random access memory blocks (BRAMs) 904, signal processing blocks (DSPs) 906, input/output blocks (IOBs) 908, and configuration and clocking logic (CONFIG/CLOCKS) 910. The FPGA 900 also includes a dedicated processor block 912, serializer-deserializer (SerDes) circuit 914, an ADC 916, digital transceivers 918, other dedicated hardblocks 919, specialized input/output blocks (IO) 920 (e.g., configuration ports and clock ports), and other programmable logic 922 such as digital clock managers, system monitoring logic, and so forth. The hardblocks 919 can be any circuit, such as a memory controller, a Peripheral Component Interconnect Express (PCIe) hardblock, etc. In some examples, the SerDes circuit 914 includes a timing adjustable asynchronous SAR ADC. In some examples, the ADC 916 includes a timing adjustable asynchronous SAR ADC In the illustrated FPGA 900, each programmable tile includes a programmable interconnect element (INT) 930 having connections to input and output terminals of respective programmable interconnect elements 930 in each adjacent tile and having connections to input and output terminals of a programmable logic element within the same tile. The programmable interconnect elements 930 taken together implement a programmable interconnect structure for the illustrated FPGA 900.

As an example, a CLB 902 includes a configurable logic element (CLE) 932 that can be programmed to implement user logic plus a single programmable interconnect element 930. A BRAM 904 can include a BRAM logic element (BRL) 934 in addition to one or more programmable interconnect elements 930. Typically, the number of interconnect elements included in a tile depends on the height of the tile. In the illustrated example, a BRAM tile has the same height as five CLBs, but other numbers (e.g., four) can also be used. A signal processing block 906 can include a DSP logic element (DSPL) 936 in addition to an appropriate number of programmable interconnect elements 930. An input/output block 908 can include, for example, two instances of an input/output logic element (IOL) 938 in addition to one instance of the programmable interconnect element 930. As will be clear to those of skill in the art, the actual I/O pads connected, for example, to the input/output logic element 938 typically are not confined to the area of the input/output logic element 938.

In the illustrated example, a horizontal area near the center of the die is used for configuration, clock, and other control logic. Vertical columns 940 extending from this horizontal area or column are used to distribute the clocks and configuration signals across the breadth of the FPGA.

Some FPGAs utilizing the architecture illustrated in FIG. 9 include additional logic blocks that disrupt the regular columnar structure making up a large part of the FPGA. The additional logic blocks can be programmable blocks and/or dedicated logic. For example, processor block 912 spans several columns of CLBs and BRAMs.

Note that FIG. 9 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 9 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. An electronic device comprising:
   an asynchronous successive approximation register (SAR) analog-to-digital converter (ADC) configured to output output data;
   a statistics monitor configured to capture samples at a bit position of the output data, the statistics monitor further being configured to generate an operational setting based on the captured samples; and
   an operation setting circuit configured to adjust an operating condition of the asynchronous SAR ADC based on the operational setting.

2. The electronic device of claim 1, wherein the asynchronous SAR ADC is configured to resolve bit positions of the output data for a sampling period successively, the asynchronous SAR ADC is configured to resolve last in the sampling period a last bit position of the bit positions, the bit position from which the captured samples are captured by the statistics monitor being the last bit position.

3. The electronic device of claim 2, wherein the last bit position is a least significant bit of the output data.

4. The electronic device of claim 1, wherein the statistics monitor is configured to adjust the operational setting when a number of a given value in the captured samples is not within an error range of half of the captured samples.

5. The electronic device of claim 1, wherein the operation setting circuit includes a variable delay circuit configured to set a reset window of a sampling period of the asynchronous SAR ADC, the variable delay circuit being configured to set the reset window based on the operational setting.

6. The electronic device of claim 1, wherein the operation setting circuit includes a variable power supply regulator configured to set a power supply voltage of the asynchronous SAR ADC, the variable power supply regulator being configured to set the power supply voltage based on the operational setting.

7. The electronic device of claim 1, wherein the asynchronous SAR ADC includes a comparator, wherein an adjusted operating condition of the asynchronous SAR ADC, resulting from the operation setting circuit, reduces a likelihood that a metastability event of the comparator prevents data of each bit position of the output data from being resolved during a respective sampling period.

8. The electronic device of claim 1, wherein the asynchronous SAR ADC comprises:

a summing circuit having a first input node selectively electrically coupled to an input node of the asynchronous SAR ADC;

a comparator, an output node of the summing circuit being electrically coupled to an input node of the comparator;

SAR logic including a capture register;

a pulse generator circuit, an output node of the comparator being electrically coupled to an input node of the SAR logic and an input node of the pulse generator circuit, the pulse generator circuit being configured to generate a control signal to control the comparator; and a digital-to-analog converter (DAC), an output node of the capture register being electrically coupled to an input node of the DAC, an output node of the DAC being electrically coupled to a second input node of the summing circuit.

9. A method of operating an electronic device, the method comprising:

capturing, by a statistics monitor, samples of a bit position of data output by an asynchronous successive approximation register (SAR) analog-to-digital converter (ADC);

determining, by the statistics monitor, a distribution of a given value in the captured samples;

generating, by the statistics monitor, an operational setting based on the distribution; and controlling, by an operation setting circuit, an operating condition of the asynchronous SAR ADC based on the operational setting.

10. The method of claim 9, wherein the asynchronous SAR ADC is configured to resolve bit positions of the data for a sampling period successively, the asynchronous SAR ADC is configured to resolve last in the sampling period a last bit position of the bit positions, the bit position from which the samples are captured by the statistics monitor being the last bit position.

11. The method of claim 10, wherein the last bit position is a least significant bit of the data.

12. The method of claim 9, wherein generating the operational setting includes adjusting the operational setting when a number of the given value in the distribution is not within an error range of half of the samples.

13. The method of claim 9, wherein controlling the operating condition of the asynchronous SAR ADC includes controlling a reset window of a sampling period of the asynchronous SAR ADC based on the operational setting.

14. The method of claim 9, wherein controlling the operating condition of the asynchronous SAR ADC includes controlling a power supply voltage of the asynchronous SAR ADC based on the operational setting.

15. The method of claim 9, wherein controlling the operating condition of the asynchronous SAR ADC reduces a likelihood that a metastability event of a comparator of the asynchronous SAR ADC prevents data of each bit position of the data output by the asynchronous SAR ADC from being resolved during a respective sampling period.

16. An electronic device comprising:

an asynchronous successive approximation register (SAR) analog-to-digital converter (ADC) comprising a comparator, the asynchronous SAR ADC being configured to resolve bit positions of digital data for a respective sampling period successively, the asynchronous SAR ADC being configured to output the digital data on an output node of the asynchronous SAR ADC;

a statistics monitor electrically coupled to the output node of the asynchronous SAR ADC and configured to capture samples of a last bit position of the digital data that the asynchronous SAR ADC is configured to resolve last for a respective sampling period and that is output by the asynchronous SAR ADC on the output node of the asynchronous SAR ADC, the statistics monitor further being configured to generate an operational setting based on a distribution of a value in the captured samples; and an operation setting circuit configured to adjust an operating condition of the comparator, based on the operational setting, to reduce a likelihood that a metastability event of the comparator prevents data of each bit position of the digital data from being resolved during a respective sampling period.

17. The electronic device of claim 16, wherein the last bit position is a least significant bit of the digital data.

18. The electronic device of claim 16, wherein the statistics monitor is configured to adjust the operational setting when the distribution of the value in the captured samples is not within an error range of half of the captured samples.

19. The electronic device of claim 16, wherein the operation setting circuit includes a variable delay circuit configured to set a reset window of a sampling period of the asynchronous SAR ADC, the variable delay circuit being configured to set the reset window based on the operational setting.

20. The electronic device of claim 16, wherein the operation setting circuit includes a variable power supply regulator configured to set a power supply voltage of the asynchronous SAR ADC, the variable power supply regulator being configured to set the power supply voltage based on the operational setting.

* * * * *